US012638494B2

(12) United States Patent
Watanabe et al.

(10) Patent No.: US 12,638,494 B2
(45) Date of Patent: May 26, 2026

(54) TESTING DEVICE AND METHOD, AND NON-TRANSITORY COMPUTER-READABLE RECORDING MEDIUM

(71) Applicant: Tokyo Electron Limited, Tokyo (JP)

(72) Inventors: Shinjiro Watanabe, Yamanashi (JP); Taisei Kondo, Hokkaido (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 18/346,431

(22) Filed: Jul. 3, 2023

(65) Prior Publication Data

US 2024/0019483 A1     Jan. 18, 2024

(30) Foreign Application Priority Data

Jul. 13, 2022     (JP) ................................. 2022-112149

(51) Int. Cl.
G01R 31/28          (2006.01)
G01R 1/04           (2006.01)
G01R 1/067          (2006.01)
G01R 1/073          (2006.01)
G01R 31/02          (2006.01)

(52) U.S. Cl.
CPC ..... G01R 31/2808 (2013.01); G01R 1/06738 (2013.01); G01R 31/2887 (2013.01)

(58) Field of Classification Search
CPC .......... G01R 31/02; G01R 31/28; G01R 1/04; G01R 1/067; G01R 1/073
See application file for complete search history.

(56) References Cited

U.S. PATENT DOCUMENTS

| 2020/0191830 A1* | 6/2020 | Watanabe | .......... G01R 1/07364 |
| 2021/0302155 A1 | 9/2021 | Matsuda | |

FOREIGN PATENT DOCUMENTS

| JP | 2019-102640 | 6/2019 | |
| JP | 2020-119476 | 8/2020 | |
| JP | 2022-032252 | 2/2022 | |
| KR | 10-2021-0018181 | 2/2021 | |
| KR | 10-2022-0072963 | 6/2022 | |
| WO | WO-2019107173 A1 * | 6/2019 | ............. G01B 11/00 |

OTHER PUBLICATIONS

Zongwei Zhou, Md Mahfuzur Rahman Siddiquee, Nima Tajbakhsh, and Jianming Liang, "UNet++: A Nested U-Net Architecture for Medical Image Segmentation", [online], [searched on Jun. 15, 2022], Internet <URL: https://arxiv.org/abs/1807.10165>.

* cited by examiner

*Primary Examiner* — Neel D Shah
(74) *Attorney, Agent, or Firm* — IPUSA, PLLC

(57)          ABSTRACT

A testing device includes photographing, segmenting, position determining, and position adjusting units. The photographing unit is configured to photograph a needle tip of a probe needle provided in a probe card used for testing of a test object. The segmenting unit is configured to recognize a needle region and a needle tip region of a validation image photographed by the photographing unit, by inputting the validation image to a segmentation model that is trained as described in the specification. The position determining unit is configured to determine a position of the needle tip based on a positional relationship between the needle region and the needle tip region. The position adjusting unit is configured to adjust a relative position between the test object and the needle tip of the probe needle based on the position of the needle tip determined by the position determining unit.

11 Claims, 11 Drawing Sheets

FIG.2

TESTING DEVICE AND METHOD, AND NON-TRANSITORY COMPUTER-READABLE RECORDING MEDIUM

CROSS-REFERENCE TO RELATED APPLICATIONS

This application is based upon and claims priority to Japanese Patent Application No. 2022-112149, filed on Jul. 13, 2022, the entire contents of which are incorporated herein by reference.

BACKGROUND

1. Field of the Invention

The present disclosure relates to a testing device, a testing method, and a non-transitory computer-readable recording medium.

2. Description of the Related Art

Japanese Laid-Open Patent Publication No. 2019-102640 discloses a testing device configured to contact the needle tips of probe needles with test pads provided on a test object and supply electrical signals to the test object via the needle tips of the probe needles, thereby testing the test object. The testing device disclosed in Japanese Laid-Open Patent Publication No. 2019-102640 determines the positions of the needle tips of the probe needles based on an image photographed so as to include the needle tips of the probe needles in a single image, and adjusts the positions of the needle tips of the probe needles based on the determined positions of the needle tips of the probe needles.

SUMMARY

According to one aspect of the present disclosure, a testing device includes a photographing unit, a segmenting unit, a position determining unit, and a position adjusting unit. The photographing unit is configured to photograph a needle tip of a probe needle provided in a probe card used for testing of a test object. The segmenting unit is configured to recognize a needle region and a needle tip region of a validation image photographed by the photographing unit, by inputting the validation image to a segmentation model that is trained using training data including training images each obtained by photographing the needle tip of the probe needle, the training images each being given a scope of the probe needle and a scope of the needle tip. The position determining unit is configured to determine a position of the needle tip based on a positional relationship between the needle region and the needle tip region. The position adjusting unit is configured to adjust a relative position between the test object and the needle tip of the probe needle based on the position of the needle tip determined by the position determining unit.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 2 is a block diagram illustrating one example of a hardware configuration of a control device according to one embodiment;

DETAILED DESCRIPTION

Figure 1:
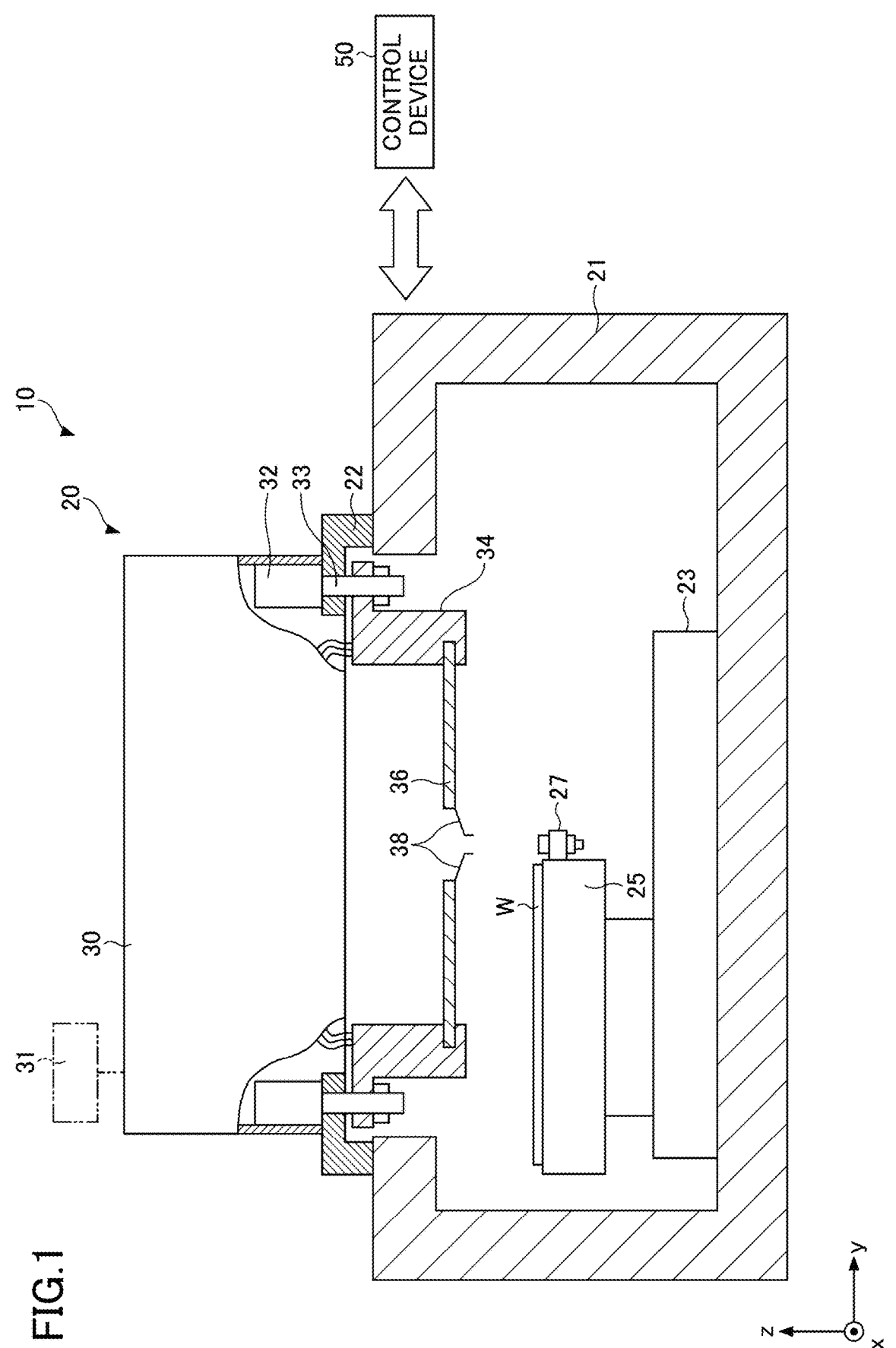
FIG. 1 is a schematic cross-sectional view illustrating one example of a testing device according to one embodiment.

The present disclosure provides a technique that can highly precisely determine the position of the needle tip of the probe needle.

Hereinafter, non-limiting embodiments of the present disclosure will be described with reference to the drawings. In the drawings, the same or corresponding members or components are designated by the same reference symbols, and duplicate description thereof may be omitted.

Embodiments

\<Overview\>

Embodiments of the present disclosure are testing devices each configured to perform electrical testing of the test object such as a semiconductor wafer. The testing device according to the present embodiment includes a probe card in which a plurality of probe needles are provided. The testing device contacts each of the probe needles provided in the probe card with a test pad provided in the test object. The testing device outputs a predetermined electrical signal to the probe card from an external tester and evaluates electrical characteristics of the test object based on an electrical signal output from the test object via the probe needle.

In order to contact the probe needle with the test pad, the testing device adjusts a relative position between the needle tip of the probe needle and the test pad. At this time, the position of the needle tip of the probe needle is determined by photographing the needle tip of the probe needle with the photographing unit (e.g., a camera) attached to a stage on which the test object is to be placed, and by recognizing the needle tip of the probe needle from the obtained image.

When a rule-based image recognition technique such as Blob analysis or Edge analysis is used to recognize the needle tip of the probe needle, it may be impossible to detect the position of the needle tip of the probe needle. This is, for example, because the tip end of the probe needle is partially lost due to abrasion or the like, or because the image does not include a part of the probe needle in accordance with a positional relationship between the position of the probe needle and the angle of view of the camera.

The testing device according to the present embodiment uses a trained segmentation model to recognize the needle region and the needle tip region from the image obtained by photographing the needle tip of the probe needle, and determines the position of the needle tip of the probe needle based on a positional relationship between the needle region and the needle tip region. The segmentation model according to the present embodiment is trained using training data including images each given the scope of the probe needle and the scope of the needle tip of the probe needle, the scope of the probe needle and the scope of the needle tip of the probe needle having no causal relationship with the image recognition results obtained by a conventional method. With the above-described configuration, the testing device according to the present embodiment can highly precisely determine the position of the needle tip of the probe needle.

Note that, the expression "having no causal relationship with the image recognition results obtained by a conventional method" means that the scope of the probe needle and the scope of the needle tip of the probe needle are information not based on the needle region and the needle tip region that are obtained as a result of image recognition performed to the images. For example, the scope of the probe needle and the scope of the needle tip of the probe needle are given to the images in response to user's operations without recognition of the needle region or the needle tip region from the images. Also, for example, the scope of the probe needle and the scope of the needle tip of the probe needle may be given, in response to user's operations, to images in which the needle region and the needle tip region recognized from the images are different from a true scope of the probe needle and a true scope of the needle tip of the probe needle.

<Configuration of the Testing Device>

FIG. 1 is a schematic cross-sectional view illustrating one example of the testing device according to the present embodiment. As illustrated in FIG. 1, a testing device 10 according to the present embodiment includes a testing device body 20 and a control device 50.

The testing device body 20 includes a hollow casing 21. At an approximately center portion in the casing 21, a moving mechanism 23 is provided. The moving mechanism 23 is configured to move a stage 25 in an up-and-down direction (a z-axis direction as illustrated in FIG. 1) and in a horizontal direction (in an xy-plane direction parallel to an x axis and a y axis as illustrated in FIG. 1). On the top face of the stage 25, a semiconductor wafer W, one example of the test object, is placed. The stage 25 adsorbs and retains the placed semiconductor wafer W on the top face of the stage 25 with, for example, a vacuum chuck.

A side face of the stage 25 is attached with a camera 27, one example of the photographing unit. The camera 27 is attached to the side face of the stage 25 such that the photographing direction faces upward. While the stage 25 is moved by the moving mechanism 23, the camera 27 attached to the side face of the stage 25 is also moved.

The moving mechanism 23 is controlled by the control device 50. An amount of movement of the moving mechanism 23 is managed by the control device 50. Therefore, the x-coordinates, y-coordinates, and z-coordinates of the positions of the stage 25 and the camera 27 in the casing 21 are managed by the control device 50.

The casing 21 has a generally circular opening in an upper portion thereof. The opening is provided with a test head 30.

The test head 30 is fixed to a frame 22 provided along a circumferential edge of the opening. In the test head 30, a plurality of tilt adjusters 32 are provided at the position of the frame 22. Below the frame 22, the tilt adjusters 32 retain a generally cylindrical holder 34 via a shaft 33.

The holder 34 detachably retains, at a lower portion thereof, the probe card 36 provided with a plurality of probe needles 38. The probe needles 38 of the probe card 36 are provided in the probe card 36 such that the needle tips thereof face downward.

The probe card 36 as illustrated in FIG. 1 includes cantilever probe needles 38. However, the probe card 36 may include vertical probe needles 38. Alternatively, the probe card 36 may include both of the cantilever probe needles 38 and the vertical probe needles 38.

The probe needles 38 are disposed on the probe card 36 so that when the semiconductor wafer W placed on the stage 25 is moved to a position for testing, the needle tips of the probe needles 38 are at such positions as to respectively contact test pads provided in the semiconductor wafer W.

The probe needles 38 are respectively electrically connected to interconnects provided on the probe card 36. The interconnects provided in the probe card 36 are electrically connected to the test head 30 via interconnects provided on the holder 34. An external tester 31 is electrically connected to the test head 30.

Here, due to, for example, an attachment error occurring when the probe card 36 is attached to the holder 34, the positions of the needle tips of the probe needles 38 may be, as a whole, off the positions corresponding to the test pads provided in the semiconductor wafer W. For example, when the probe card 36 is shifted in a horizontal direction in the attachment thereof, all of the positions of the needle tips of the probe needles 38 are shifted by a certain amount in the horizontal direction. When the positions of the needle tips of the probe needles 38 are greatly shifted in the horizontal direction, the needle tips of the probe needles 38 do not contact the corresponding test pads.

Therefore, in the present embodiment, first, the control device 50 detects, before testing, the positions of the probe needles 38 using the camera 27. Next, for each of the probe needles 38, the control device 50 calculates an error between the position of the needle tip of the probe needle 38 and the position of the test pad. Then, based on the calculated error, the control device 50 adjusts a relative position between the probe needle 38 and the semiconductor wafer W.

In the testing device body 20 that is configured in the above-described way, the semiconductor wafer W placed on the stage 25 is tested. First, the control device 50 controls the moving mechanism 23 so that the camera 27 is positioned below the probe needles 38. Next, the control device 50 instructs the camera 27 so as to photograph the probe needles 38. Subsequently, based on an image photographed by the camera 27, the control device 50 measures the position of the needle tip of each probe needle 38 in the horizontal direction. Then, the control device 50 adjusts the position of the stage 25 in the horizontal direction by controlling the moving mechanism 23 so as to correct displacement of the needle tip of each probe needle 38 in the horizontal direction.

The control device 50 controls the moving mechanism 23 to ascend the stage 25 on which the semiconductor wafer W is placed, thereby contacting the probe needle 38 with each test pad on the semiconductor wafer W at a predetermined over drive amount. The over drive amount is an ascending amount by which the stage 25 including the semiconductor wafer W thereon is further ascended after the stage 25 has been ascended until the probe needle 38 contacts the test pad on the semiconductor wafer W.

The control device 50 controls the external tester 31 to output predetermined electrical signals to the test head 30. The test head 30 outputs the electrical signals, output from the external tester 31, to the probe card 36 via the interconnects in the holder 34. The electrical signals output to the probe card 36 are respectively supplied to the probe needles 38 via the interconnects in the probe card 36 and output to the test pads of the semiconductor wafer W via the probe needles 38.

The electrical signals output from the test pads on the semiconductor wafer W are output to the probe needles 38. The electrical signals output to the probe needles 38 are output to the test head 30 via the interconnects in the probe card 36 and the interconnects in the holder 34. The electrical signals output to the test head 30 are output to the external tester 31. Based on the electrical signals output to the test head 30 and on the electrical signals output from the test head 30, the external tester 31 evaluates electrical characteristics of the semiconductor wafer W and outputs the evaluation results to the control device 50.

Note that, when failures such as breakage or deformation occur in the probe needles 38, even if a positional adjustment in the horizontal direction is made by the moving mechanism 23, it is difficult to perform correct testing. Therefore, when such breakage or deformation, or other failures are detected in the needle tips of the probe needles 38 based on the image photographed by the camera 27, the control device 50 notifies an error to an operator via, for example, a display, thereby recommending maintenance or exchange of the probe card 36.

<Hardware Configuration of the Control Device>

Figure 2:
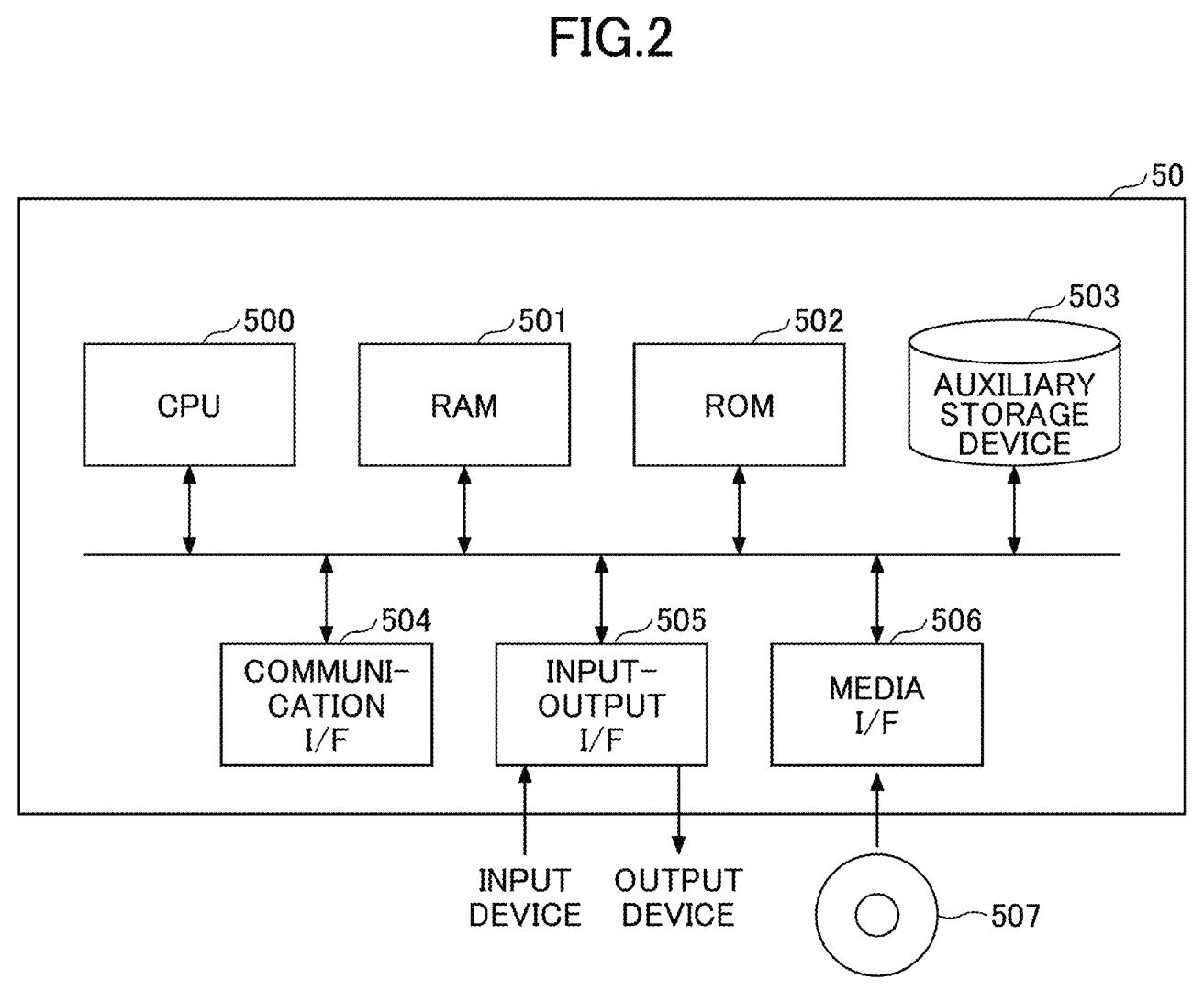

FIG. 2 is a block diagram illustrating one example of the hardware configuration of the control device 50 according to the present embodiment. As illustrated in FIG. 2, the control device 50 includes a central processing unit (CPU) 500, a random access memory (RAM) 501, a read only memory (ROM) 502, an auxiliary storage device 503, a communication interface (I/F) 504, an input-output interface (I/F) 505, and a media interface (I/F) 506.

The CPU 500 is driven in accordance with a program stored in the ROM 502 or the auxiliary storage device 503, thereby controlling the components. The ROM 502 stores, for example, a boot program executed by the CPU 500 upon the start of the control device 50, and a program dependent on the hardware of the control device 50.

The auxiliary storage device 503 is, for example, a hard disk drive (HDD) or a solid state drive (SSD). The auxiliary storage device 503 stores, for example, a program executed by the CPU 500 and data used by the program. The CPU 500 reads out this program from the auxiliary storage device 503 to load the program on the RAM 501, and executes the loaded program.

The communication I/F 504 performs communication with the testing device body 20 via a communication line such as a local area network (LAN). The communication I/F 504 receives data from the testing device body 20 via the communication line and transmits the data to the CPU 500. Then, the communication I/F 504 transmits data generated by the CPU 500 to the testing device body 20 via the communication line.

The CPU 500 controls, via the input-output I/F 505, an input device such as a keyboard and an output device such as a display. The CPU 500 obtains a signal input from the input device via the input-output I/F 505, and transmits the signal to the CPU 500. Also, the CPU 500 outputs the generated data to the output device via the input-output I/F 505.

The media I/F 506 reads a program or data stored in a recording medium 507, and stores the program or data in the auxiliary storage device 503. Examples of the recording medium 507 include: optical recording media such as digital versatile discs (DVDs) and phase change rewritable disks (PDs); magneto-optical recording media such as magneto-optical disks (MOs); tape media; magnetic recording media; and semiconductor memories.

The CPU 500 of the control device 50 reads, from the recording medium 507, a program to be loaded on the RAM 501, and stores the program in the auxiliary storage device 503. In another example, such a program may be obtained from another device via a communication line and stored in the auxiliary storage device 503.

<Functional Configuration of the Control Device>

Figure 3:
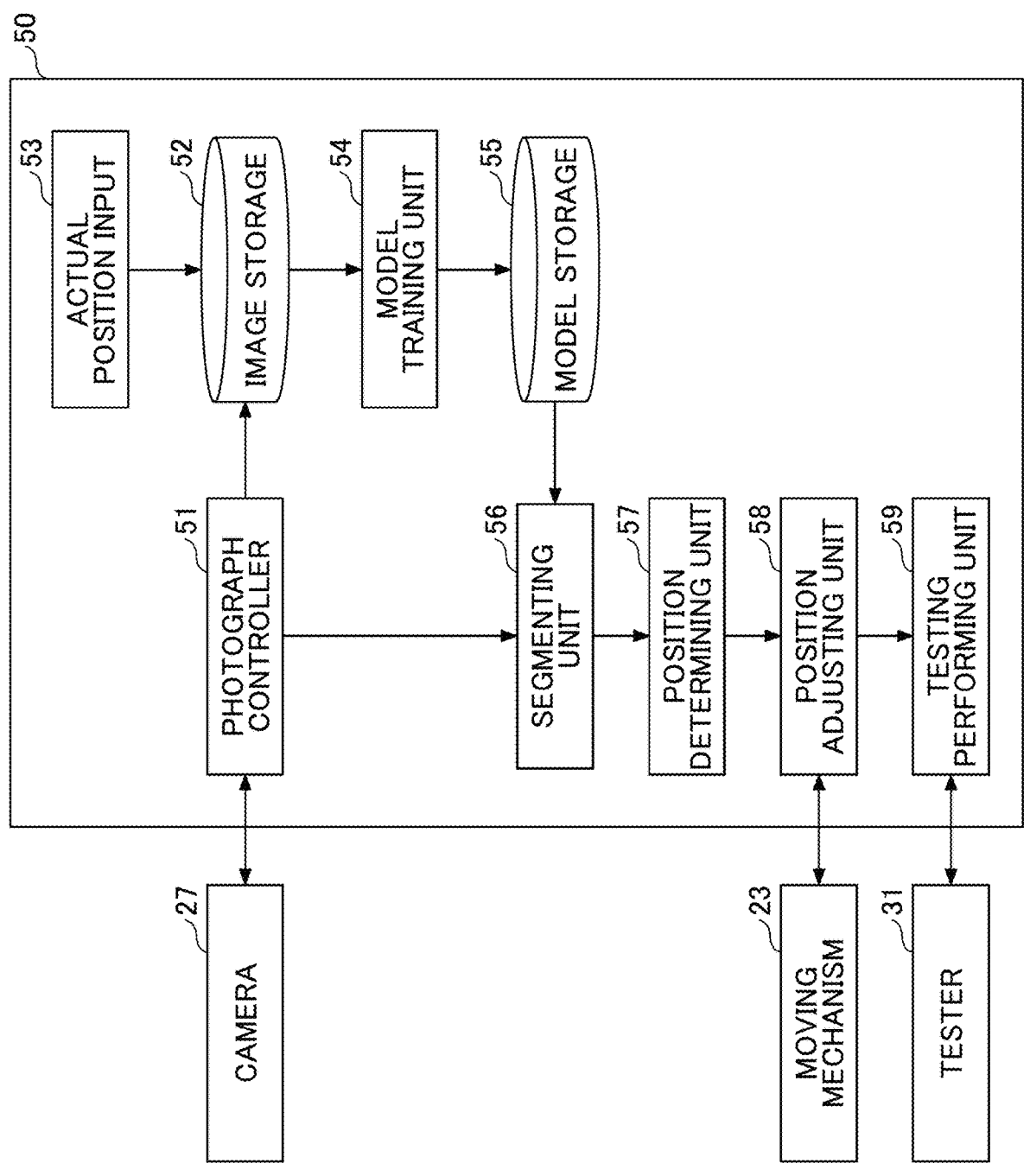
FIG. 3 is a block diagram illustrating one example of a functional configuration of the control device according to one embodiment.

FIG. 3 is a block diagram illustrating one example of the functional configuration of the control device 50 according to the present embodiment. As illustrated in FIG. 3, the control device 50 according to the present embodiment includes a photograph controller 51, an image storage 52, an actual position input 53, a model training unit 54, a model storage 55, a segmenting unit 56, a position determining unit 57, a position adjusting unit 58, and a testing performing unit 59.

The photograph controller 51, the actual position input 53, the model training unit 54, the segmenting unit 56, the position determining unit 57, the position adjusting unit 58, and the testing performing unit 59 are realized when, for example, the CPU 500 as illustrated in FIG. 2 executes the program loaded on the RAM 501. The image storage 52 and the model storage 55 are realized by, for example, the RAM 501 or the auxiliary storage device 503 as illustrated in FIG. 2.

The photograph controller 51 controls the camera 27 to photograph the needle tip of the probe needle 38 (hereinafter an image photographed by the camera 27 will also be referred to as a "needle tip image"). When the needle tip image used for training the segmentation model (hereinafter also referred to as a "training image") is photographed, the photograph controller 51 stores the training image in the image storage 52. When the needle tip image used for determining the position of the needle tip of the probe needle (hereinafter also referred to as a "validation image") is photographed, the photograph controller 51 transmits the validation image to the segmenting unit 56.

The image storage 52 stores a plurality of training images that are photographed by the camera 27. No particular limitation is imposed on the number of the training images, as long as the number of the training images is sufficient for training the segmentation model. A sufficient number of the training images for training the segmentation model is different in accordance with the type of a model, but is, for example, about 50 images.

In response to user's operations, the actual position input 53 receives an input of information representing the scope of the probe needle 38 (the actual value of the needle region) and the scope of the needle tip of the probe needle 38 (the actual value of the needle tip region) that are photographed in the training images (hereinafter this information will also be referred to as "actual position information"). The actual position input 53 gives the received actual position information to the training images, and stores the resulting training images in the image storage 52. Hereinafter, the training images given the actual position information will also be referred to as "training data". The training data function as teaching data. The validation image is not used as the training data.

The model training unit 54 trains the segmentation model based on the training data stored in the image storage 52. The segmentation model uses the needle tip image as an input, and outputs an image in which the pixels of the needle tip image are segmented into the needle region, the needle tip region, and the other region. The needle region is a region including the probe needle 38. The needle tip region is a region including the needle tip of the probe needle 38. The other region is a region other than the needle region and the needle tip region.

The model storage 55 stores the segmentation model that is trained in the model training unit 54.

The segmenting unit 56 inputs the validation image photographed by the camera 27 to the trained segmentation model, thereby segmenting the validation image into the needle region, the needle tip region, and the other region. Hereinafter, an image obtained by segmenting the validation image into these regions will be referred to as a "segmented image".

The position determining unit 57 determines the position of the needle tip of the probe needle 38 based on a positional relationship between the needle region and the needle tip region included in the segmented image. When the segmented image includes a plurality of needle regions, the position determining unit 57 determines the position of the needle tip for each of the needle regions.

The position adjusting unit 58 controls the moving mechanism 23 to contact the test pad provided on the test object with the needle tip of the probe needle 38. At this time, the position adjusting unit 58 adjusts a relative position between the needle tip of the probe needle 38 and the test pad based on the information representing the position of the needle tip of the probe needle 38 determined by the position determining unit 57. Note that, in the present embodiment, a positional relationship in the Z-axis direction between the needle tip of the probe needle 38 and the test pad is correctly adjusted.

The testing performing unit 59 instructs the external tester 31 to start testing, thereby starting the testing of the semiconductor wafer W.

<Procedure of the Training Method>

Figure 4:
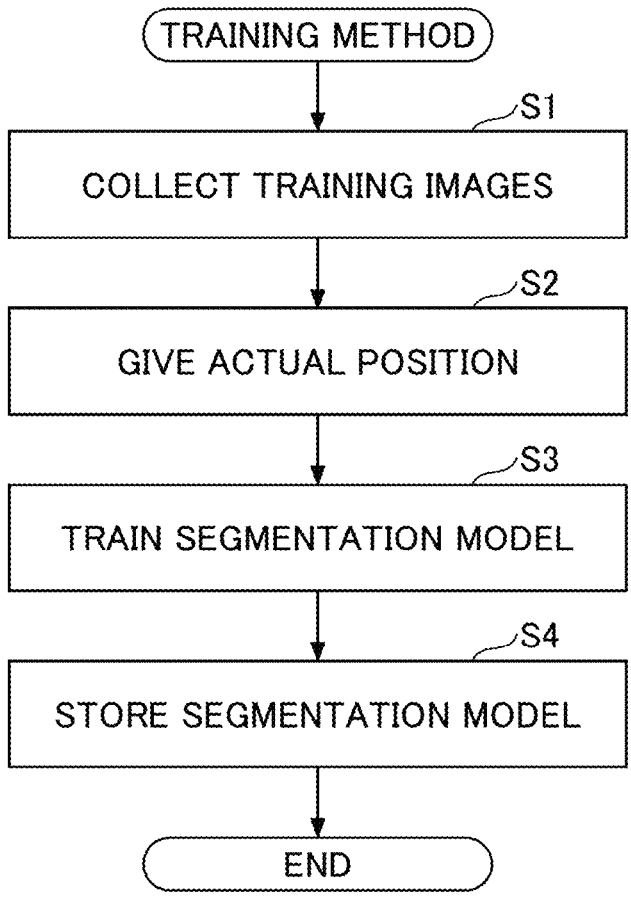
FIG. 4 is a flowchart illustrating one example of a training method according to one embodiment.

FIG. 4 is a flowchart illustrating one example of the training method according to the present embodiment. The training method according to the present embodiment is a method of training the segmentation model that segments the needle tip image into the regions.

In step S1, the photograph controller 51 controls the camera 27 to photograph the needle tip of the probe needle 38. The photograph controller 51 may control the camera 27 so as to photograph the needle tips of a plurality of probe needles 38 in a single image, or so as to photograph the needle tip of one probe needle 38 in a single image.

The photograph controller 51 stores the training images photographed by the camera 27 in the image storage 52. At this time, the photograph controller 51 stores the training images, with information representing the photographing positions being associated with the needle tip images. The information representing the photographing positions is, for example, a coordinate on the xy plane at which the camera 27 is positioned at the time of the photographing.

<<Needle Tip Image>>

Figure 5:
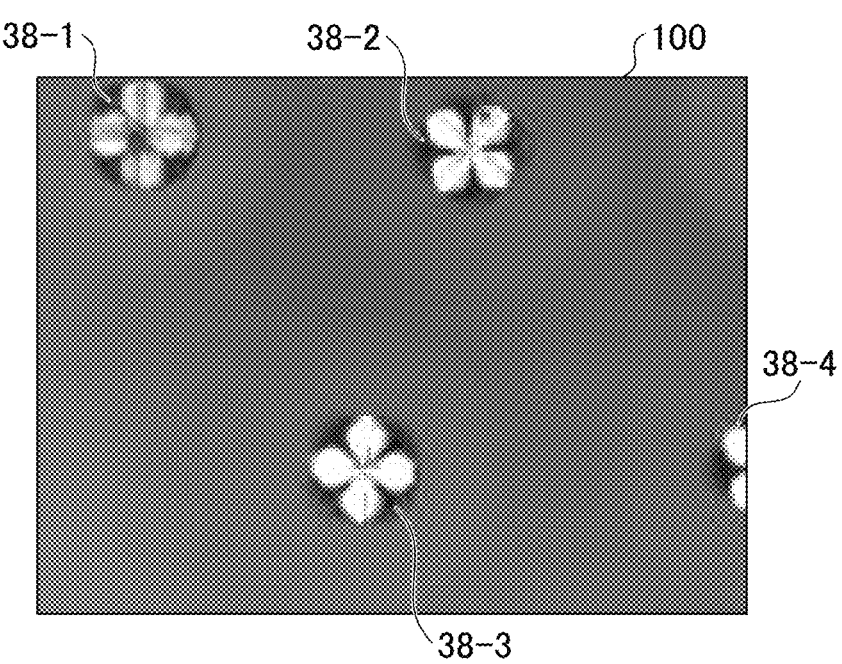
FIG. 5 illustrates one example of an image of a needle tip according to one embodiment.

FIG. 5 illustrates one example of the needle tip image according to the present embodiment. As illustrated in FIG. 5, a needle tip image 100 according to the present embodiment includes the needle tips of the probe needles 38. In the example as illustrated in FIG. 5, the needle tip image 100 includes four probe needles 38-1 to 38-4. However, no particular limitation is imposed on the number of the probe needles 38 photographed in one needle tip image 100.

FIG. 4 will be referred back to for the following description. In step S2, in response to user's operations, the actual position input 53 receives an input of the actual position information to be given to the training image. The actual position input 53 gives the received actual position information to the training image, thereby generating the training data. The actual position input 53 stores the generated training data in the image storage 52.

The actual position input 53 may receive the input of the actual position information for all of the training images stored in the image storage 52, or may receive the input of the actual position information for some of the training images stored in the image storage 52. For example, the actual position input 53 may receive the input of the actual position information for only the training images that cannot be correctly recognized for the positions of the needle tips by a conventional rule-based image recognition technique.

When the training image includes a plurality of probe needles 38, the actual position input 53 may receive the input of the actual position information for all of the probe needles 38 included in the training image, or may receive the input of the actual position information for some of the probe needles 38 included in the training image. For example, when the scope of the probe needle 38 is not entirely included in the training image like the probe needle 38-4 as illustrated in FIG. 5, the actual position input 53 may not receive the input of the actual position information for this probe needle 38.

When the actual position input 53 receives the input of the actual position information for only the training images that cannot be correctly recognized for the positions of the needle tips by a conventional rule-based image recognition technique, the actual position input 53 first recognizes the positions of the needle tips of the probe needles 38 from all of the training images stored in the image storage 52. Next, a user selects a training image in which the position of the needle tip of the probe needle 38 obtained as the recognition result is different from the true position of the needle tip of the probe needle 38 photographed in the training image. Subsequently, the user inputs the scope of the probe needle 38 and the scope of the needle tip of the probe needle 38 that are photographed in the training image. Then, the actual position input 53 gives the actual position information input by the user to the training image, and stores the resulting training image in the image storage 52.

<<Training Data>>

Figure 6A:
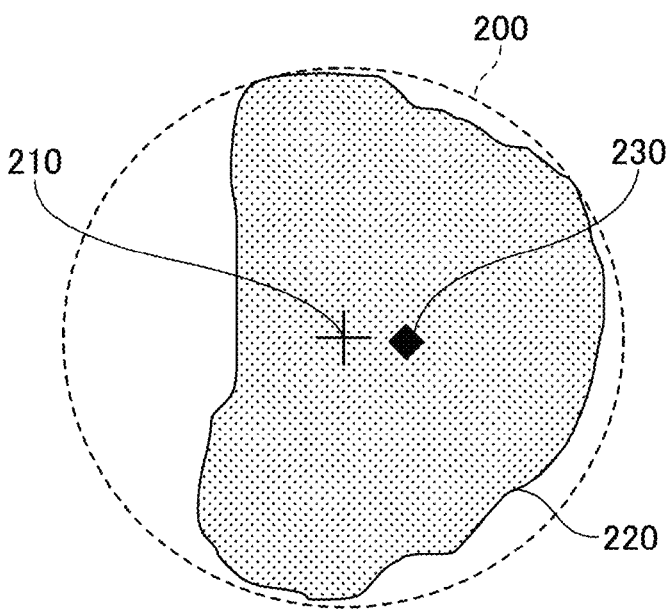
FIG. 6A illustrates one example of training data according to one embodiment.
Figure 6B:
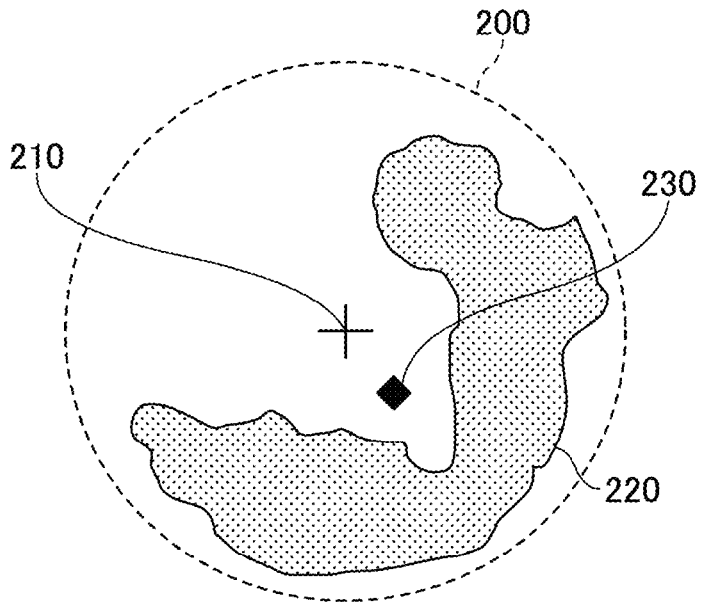
FIG. 6B illustrates another example of the training data according to one embodiment.

FIG. 6A illustrates one example of the training data according to the present embodiment, and FIG. 6B illustrates another example of the training data according to the present embodiment. FIG. 6A and FIG. 6B illustrate a true scope 200 of the probe needle 38 and a true position 210 of the needle tip, and a scope 220 of the probe needle 38 and a position 230 of the needle tip that are recognized by a rule-based image recognition technique. Note that, the recognized position 230 of the needle tip is a position of the centroid of the recognized scope 220 of the probe needle 38.

In the training image as illustrated in FIG. 6A, the recognized scope of the probe needle 38 is a vertically long elliptical shape, with a part of the left-hand region being not recognized. As a result, the recognized position 230 of the needle tip is shifted rightward of the true position 210 of the needle tip.

In the training image as illustrated in FIG. 6B, the recognized scope of the probe needle 38 is a U shape, with the central portion including the true position 210 of the needle tip being not recognized. As a result, the recognized position 230 of the probe needle 38 is greatly shifted from the true position 210 of the needle tip.

In this way, in the rule-based image recognition technique, the scope of the needle tip and the position of the needle tip may not be correctly recognized. In this case, the training image in which the position of the needle tip is not correctly recognized is given, as the actual position information, the true scope 200 of the probe needle 38 (the actual value of the needle region) and the true position 210 of the needle tip (the actual value of the needle tip region), thereby generating the training data. By training the segmentation model using the training data generated in this way, it is possible to highly precisely recognize the needle region and the needle tip region.

FIG. 4 will be referred back to for the following description. In step S3, the model training unit 54 reads out the training data stored in the image storage 52. Next, the model training unit 54 trains the segmentation model using the read-out training data. The segmentation model according to the present embodiment uses the needle tip image as an input, and outputs an image in which the pixels of the needle tip image are segmented into the needle region, the needle tip region, and the other region.

The segmentation model according to the present embodiment is, for example, a deep learning model that performs semantic segmentation based on deep learning. One example of the semantic segmentation based on deep learning is UNet++ disclosed in Referential Document 1.

[Referential Document 1] Zongwei Zhou, Md Mahfuzur Rahman Siddiquee, Nima Tajbakhsh, and Jianming Liang, "UNet++: A Nested U-Net Architecture for Medical Image Segmentation", [online], [searched on Jun. 15, 2022], Internet <URL: https://arxiv.org/abs/1807.10165>

When the model training unit 54 trains the segmentation model, the model training unit 54 performs deep learning so as to optimize an error in the position of the needle tip of the probe needle 38. Therefore, the model training unit 54 uses a loss function including a term representing an error in the position of the centroid of the needle region and a term representing an error in the position of the centroid of the needle tip region (hereinafter also referred to as a "centroid loss").

The error in the position of the centroid of the needle region is a straight-line distance, on the xy plane, between the position of the centroid of the scope of the probe needle 38 given to the training image and the position of the centroid of the needle region recognized from the training image. The error in the position of the centroid of the needle tip region is a straight-line distance, on the xy plane, between the position of the centroid of the scope of the needle tip region of the probe needle 38 given to the training image and the position of the centroid of the needle tip region recognized from the training image.

Specifically, the loss function "loss" in the present embodiment is expressed by the following formulae (1) to (4), where an estimated value of the position of the centroid of the needle region is $(x_{needle}, y_{needle})$, an actual value of the position of the centroid of the needle region is $(\hat{x}_{needle}, \hat{y}_{needle})$, an estimated value of the position of the centroid of the needle tip region is $(x_{tip}, y_{tip})$, and an actual value of the position of the centroid of the needle tip region is $(\hat{x}_{tip}, \hat{y}_{tip})$. Note that, the symbol "^" should be put directly above the letter just after it. However, the symbol "^" is put just before that letter in the specification excluding the mathematical formula below due to limitations to usable texts. In the mathematical formula, the symbol "^" is put directly above that letter in the way it should be.

$$loss = BCEDiceLoss + centerloss_{needle} + centerloss_{tip} \quad (1)$$

$$centerloss = MSEloss + L1loss \quad (2)$$

$$MSEloss = \frac{(\hat{y}_i - y_i)^2 + (\hat{x}_i - x_i)^2}{2} \quad (3)$$

$$L1loss = \frac{|\hat{y}_i - y_i| + |\hat{x}_i - x_i|}{2} \quad (4)$$

Here, the "BCEDiceLoss" is a conventional loss function used in Unet++ described in Referential Document 1. The "centerloss$_{needle}$" is an error in the position of the centroid of the needle region. The "centerloss$_{tip}$" is an error in the position of the centroid of the needle tip region. Therefore, "centerloss$_{needle}$+centerloss$_{tip}$" in Formula (1) is the centroid loss.

Note that, the segmentation model is not limited to the above model, and may be any model as long as it is a segmentation model that can perform machine learning based on the needle tip image given the actual position information. Another example of the segmentation model is an instance segmentation model or panoptic segmentation.

In step S4, the model training unit 54 stores the segmentation model trained in step S3 in the model storage 55.

<Procedure of the Testing Method>

Figure 7:
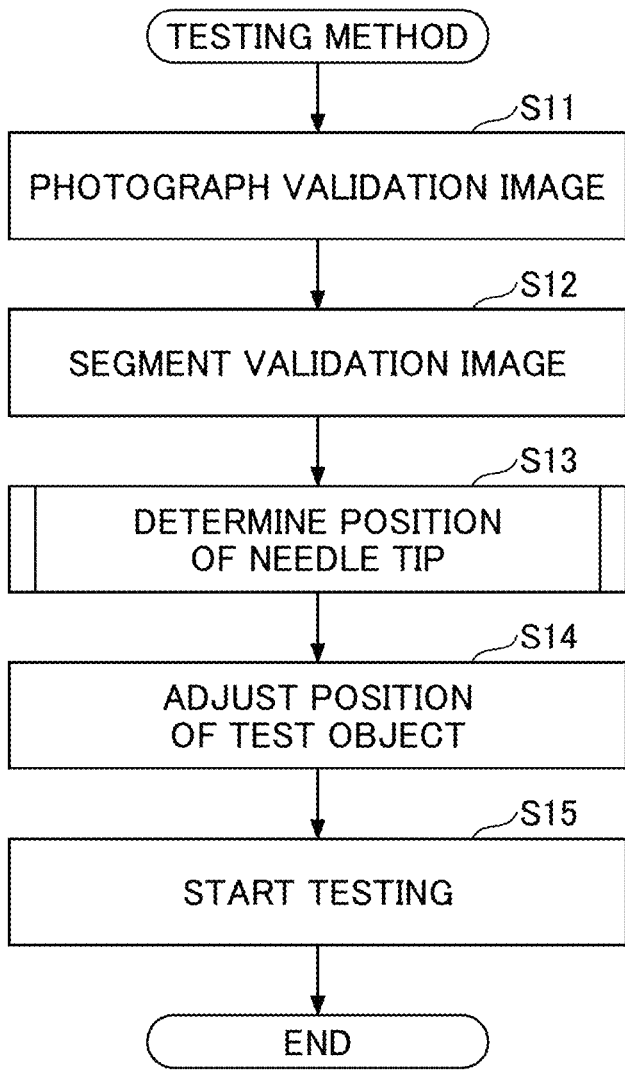
FIG. 7 is a flowchart illustrating one example of a testing method according to one embodiment.

FIG. 7 is a flowchart illustrating one example of the testing method according to the present embodiment. The testing method according to the present embodiment is a method that adjusts a relative position between the probe needle and the test object using the trained segmentation model, and performs testing of the test object.

In step S11, the photograph controller 51 controls the camera 27 to photograph the needle tip of the probe needle 38. The photograph controller 51 transmits the validation image photographed by the camera 27 to the segmenting unit 56.

In step S12, the segmenting unit 56 receives the validation image from the photograph controller 51. Next, the segmenting unit 56 reads out the trained segmentation model from the model storage 55. Subsequently, the segmenting unit 56 inputs the received validation image to the read-out segmentation model. Thereby, the segmenting unit 56 obtains the segmented image obtained by segmenting the validation image into the needle region, the needle tip region, and the other region. The segmenting unit 56 transmits the obtained segmented image to the position determining unit 57.

<<Segmented Image>>

Figure 8:
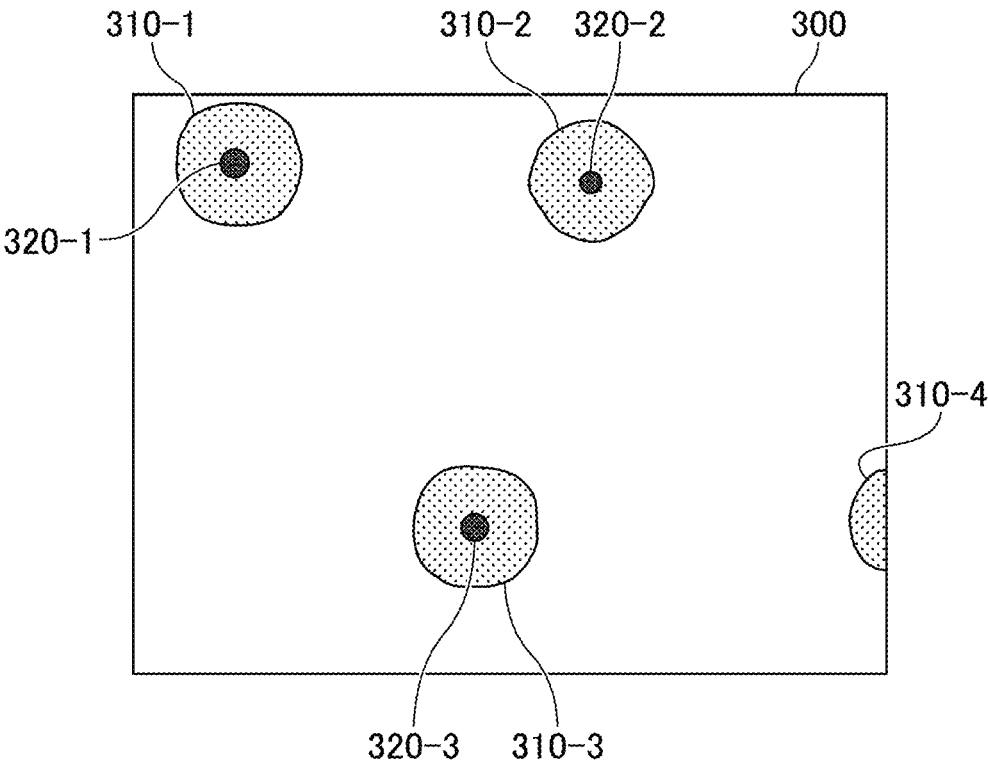
FIG. 8 illustrates one example of a segmented image according to one embodiment.

FIG. 8 illustrates one example of the segmented image according to the present embodiment. FIG. 8 is the result of segmentation of the needle tip image 100 as illustrated in FIG. 5 using the trained segmentation model.

As illustrated in FIG. 8, a segmented image 300 according to the present embodiment includes: a needle region 310 (310-1 to 310-4) corresponding to the scope of the needle tip of the probe needle 38; and a needle tip region 320 (320-1 to 320-3) corresponding to the position of the needle tip of the probe needle 38. The segmentation model according to the present embodiment is trained using the training data given the positional relationship between the scope of the probe needle 38 and the scope of the needle tip of the probe needle 38, as illustrated in FIG. 6. Thus, it is expected that the needle tip region 320 is recognized to be positioned in a given needle region 310.

FIG. 7 will be referred back to for the following description. In step S13, the position determining unit 57 receives a segmented image from the segmenting unit 56. Next, the position determining unit 57 determines the position of the needle tip of the probe needle 38 based on a positional relationship between the needle region and the needle tip region included in the received segmented image. Note that, when the segmented image includes a plurality of needle regions, the position determining unit 57 determines the position of the needle tip for each of the needle regions.

<<Procedure of the Position Determining Process>>

Figure 9:
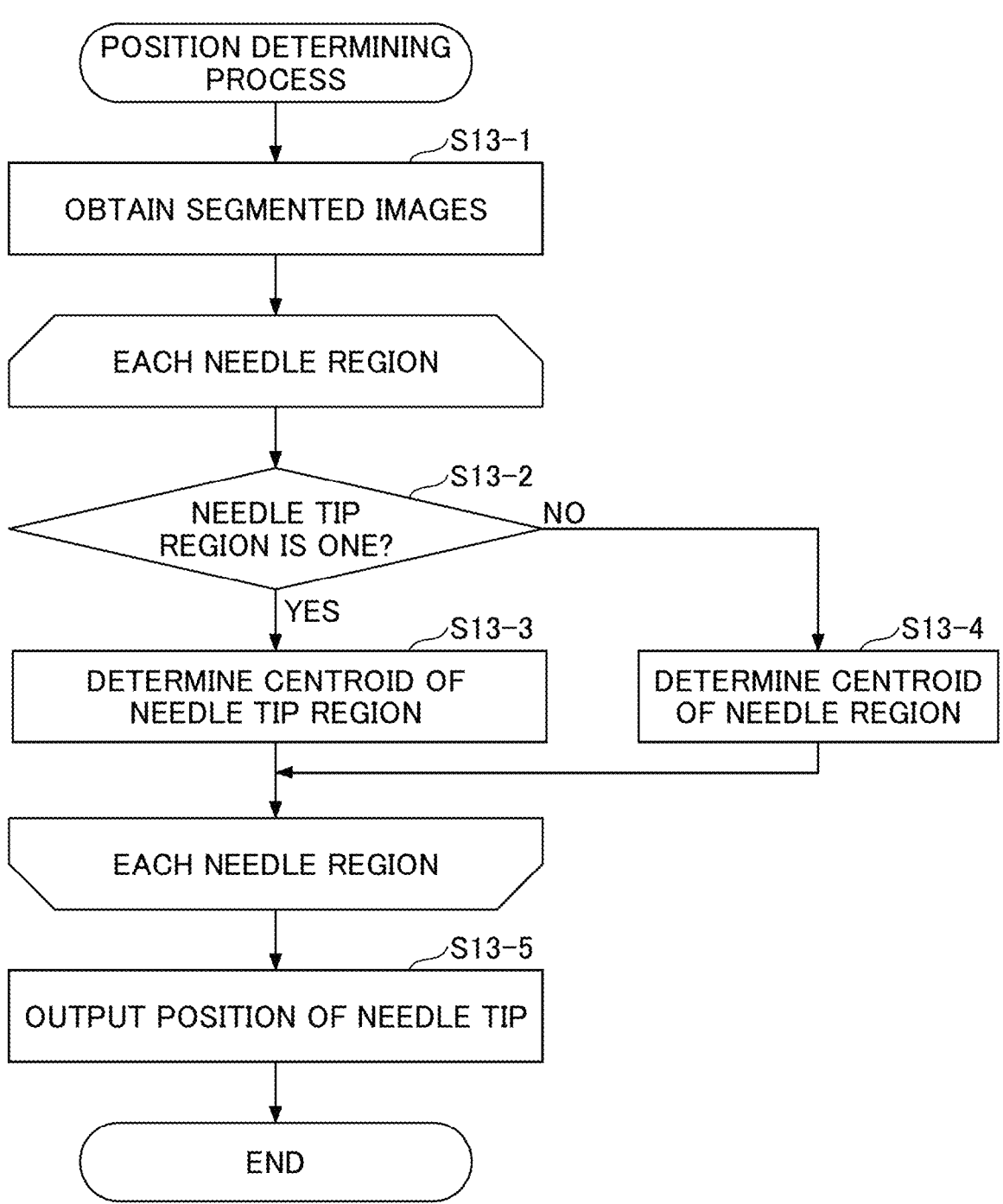
FIG. 9 is a flowchart illustrating one example of a position determining process according to one embodiment.

FIG. 9 is a flowchart illustrating one example of the position determining process according to the present embodiment (step S13 in FIG. 7).

In step S13-1, the position determining unit 57 receives a segmented image from the segmenting unit 56. The position determining unit 57 selects a to-be-processed needle region from the needle regions included in the segmented image.

In step S13-2, the position determining unit 57 obtains the number of the needle tip regions included in the needle region selected in step S13-1. When the number of the needle tip regions included in the needle region is one (YES), the position determining unit 57 moves the process to step S13-3. When the needle region does not include the needle tip region or when the needle region includes two or more needle tip regions (NO), the position determining unit 57 moves the process to step S13-4.

In step S13-3, the position determining unit 57 determines the position of the centroid of the needle tip region in the needle region selected in step S13-1. The position determining unit 57 determines the determined position of the centroid of the needle tip region as the position of the needle tip of the probe needle 38.

In step S13-4, the position determining unit 57 determines the position of the centroid of the needle region selected in step S13-1. The position determining unit 57 determines the determined position of the centroid of the needle region as the position of the needle tip of the probe needle 38.

When the segmented image photographed in step S13-1 includes a plurality of needle regions, steps of S13-2 to S13-4 are performed for each of the needle regions.

In step S13-5, the position determining unit 57 outputs information representing the position of the needle tip of the probe needle 38 determined in step S13-3 or S13-4. The position of the needle tip determined by the position determining unit 57 is a coordinate of the position of the needle tip in the validation image. Therefore, the position determining unit 57 uses the coordinate representing the photographing position stored and associated with the validation image, and converts the coordinate of the position of the needle tip in the validation image to a coordinate on the xy plane, thereby outputting the converted coordinate as information representing the position of the needle tip of the probe needle 38.

Figure 10A:
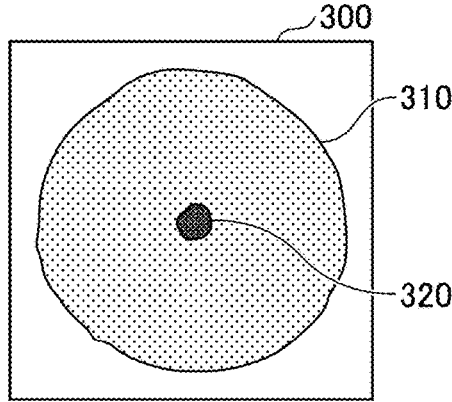
FIG. 10A illustrates one example of the segmented image according to one embodiment.
Figure 10B:
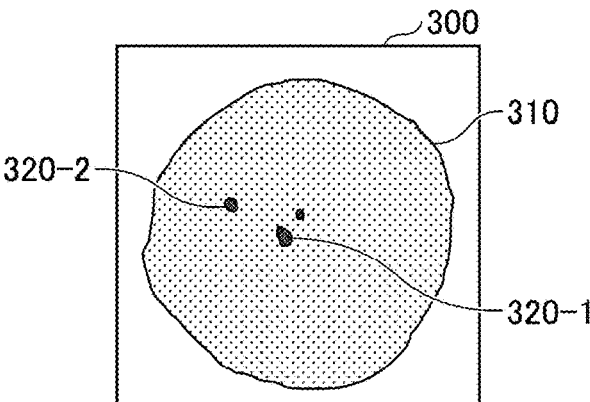
FIG. 10B illustrates another example of the segmented image according to one embodiment.
Figure 10C:
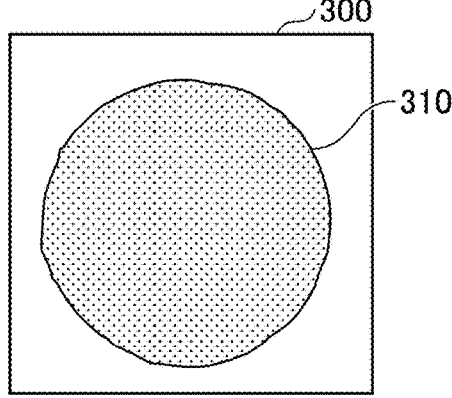
FIG. 10C illustrates still another example of the segmented image according to one embodiment.

FIGS. 10A to 10C each illustrate one example of the segmented image according to the present embodiment. FIG. 10A is an example of the segmented image in which the needle region 310 includes one needle tip region 320. As illustrated in FIG. 10A, when the needle region 310 includes one needle tip region 320, the position determining unit 57 determines the position of the centroid of the needle tip region 320 as the position of the needle tip of the probe needle 38.

FIG. 10B is an example of the segmented image in which the needle region 310 includes a plurality of needle tip regions 320-1 and 320-2. As illustrated in FIG. 10B, when the needle region 310 includes a plurality of needle tip regions 320, the position determining unit 57 determines the position of the centroid of the needle region 310 as the position of the needle tip of the probe needle 38.

FIG. 10C is an example of the segmented image in which the needle region 310 does not include the needle tip region. As illustrated in FIG. 10C, when the needle region 310 does not include the needle tip region, the position determining unit 57 determines the position of the centroid of the needle region 310 as the position of the needle tip of the probe needle 38.

FIG. 7 will be referred back to for the following description. In step S14, the position adjusting unit 58 controls the moving mechanism 23 to move the stage 25, on which the semiconductor wafer W is placed, below the probe needle 38. Next, the position adjusting unit 58 adjusts a relative position between the needle tip of the probe needle 38 and the test pad based on the information representing the position of the needle tip of the probe needle 38 determined by the position determining unit 57.

Specifically, first, the position adjusting unit 58 calculates a difference in the position of the needle tip in the xy plane between the needle tip of the probe needle 38 and the test pad on the semiconductor wafer W that contacts the needle tip of the probe needle 38, based on the information representing the position of the needle tip of the probe needle 38 determined by the position determining unit 57. Next, the position adjusting unit 58 adjusts the position of the semiconductor wafer W in the xy plane based on the difference in the position of the needle tip.

Then, the position adjusting unit 58 controls the moving mechanism 23 to ascend the stage 25 so that the test pad on the semiconductor wafer W contacts the needle tip of the probe needle 38. Thereby, the needle tips of the probe needles 38 provided in the probe card contact the corresponding test pads.

In step S15, the testing performing unit 59 instructs the external tester 31 to start testing, thereby starting the testing of the semiconductor wafer W. The external tester 31 outputs a predetermined electrical signal to the test head 30. The external tester 31 evaluates electrical characteristics of the semiconductor wafer W based on an electrical signal input to and output from the semiconductor wafer W via the probe needle 38, and outputs the evaluation results to the testing performing unit 59.

<Validation Results>

Figure 11:
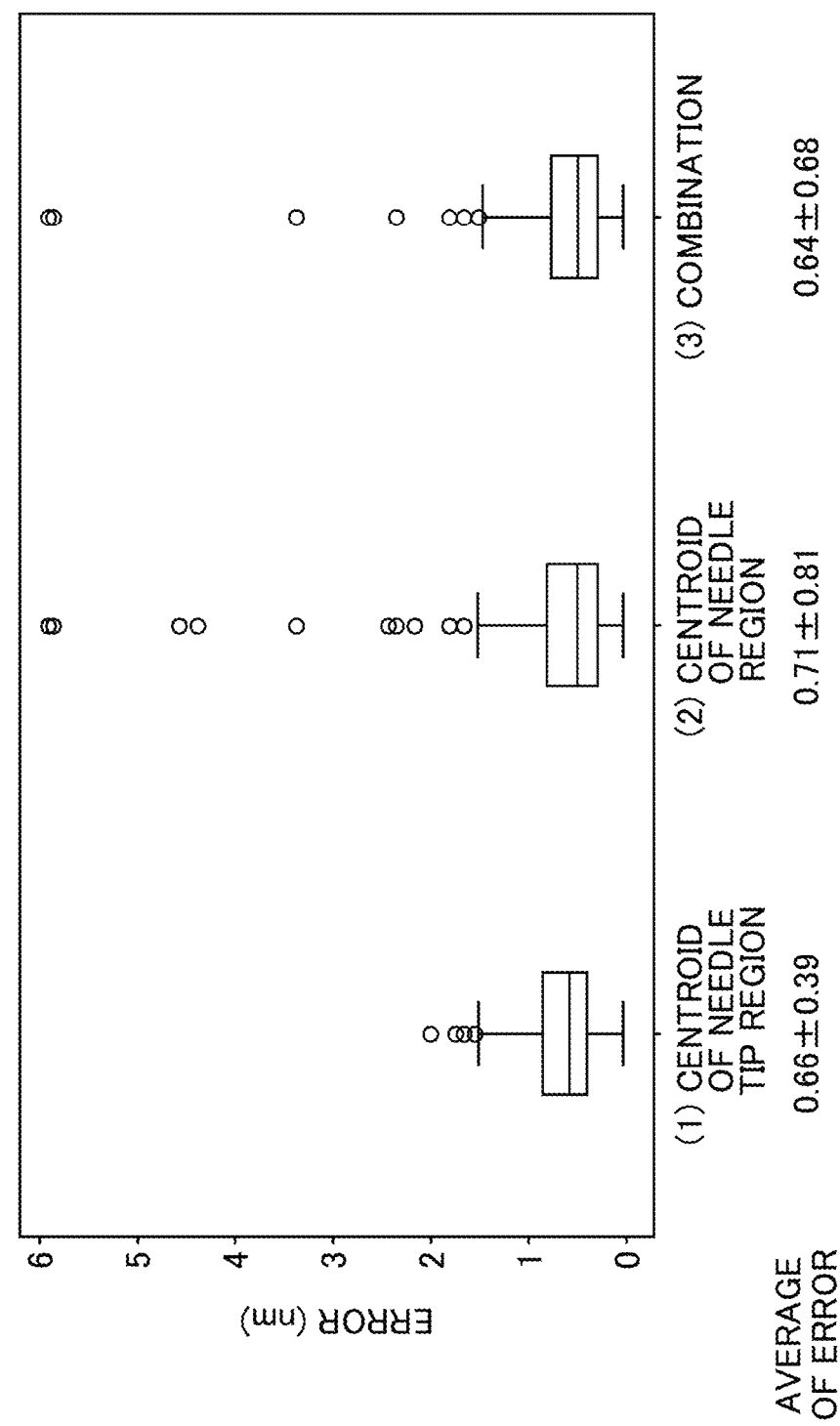
FIG. 11 is a graph illustrating one example of validation results according to one embodiment.

FIG. 11 is a graph illustrating one example of the validation results according to the present embodiment.

FIG. 11 illustrates the following (1) to (3) with box plots:

(1) an error in the true position of the needle tip with the position of the needle tip being the centroid of the needle tip region;

(2) an error in the true position of the needle tip with the position of the needle tip being the centroid of the needle region; and (3) an error in the true position of the needle tip with the position of the needle tip being determined through the above-described position determining process.

As illustrated in FIG. 11, (1) the error in the true position of the needle tip with the position of the needle tip being the centroid of the needle tip region was found to be 0.66 nanometers on average; and (2) the error in the true position of the needle tip with the position of the needle tip being the centroid of the needle region was found to be 0.71 nanometers on average. Meanwhile, (3) the error in the true position of the needle tip with the position of the needle tip being determined through the position determining process was found to be 0.64 nanometers on average. Therefore, by determining the position of the needle tip through the position determining process, the result having the smallest error is obtained.

As described above, the present validation results indicated that according to the position determining process in the present embodiment, it was possible to highly precisely determine the position of the needle tip of the probe needle. Also, a variation in (3) the error in the true position of the needle tip with the position of the needle tip being determined through the position determining process is ±0.68 nanometers, which is an approximately middle value between a variation in (1) and a variation in (2). This indicates that the extent of the variation is not disadvantageous.

Effects of the Embodiments

The testing device 10 according to the present embodiment inputs the image obtained by photographing the needle tip of the probe needle, to the trained segmentation model, thereby recognizing the needle region and the needle tip region of the image and determining the needle tip of the probe needle based on the positional relationship between the needle region and the needle tip region. The segmentation model is trained using the training data including the images each given the scope of the probe needle and the scope of the needle tip of the probe needle. Therefore, according to the testing device 10 according to the present embodiment, it is possible to highly precisely determine the position of the needle tip of the probe needle. Therefore, according to the testing device 10 according to the present embodiment, it is possible to reliably contact the needle tip of the probe needle with the test pad of the test object.

The testing device 10 according to the present embodiment, the position of the needle tip is determined based on the needle region or the needle tip region in accordance with the number of the needle tip regions included in the needle region. Specifically, the testing device 10 according to the present embodiment determines the position of the centroid of the needle tip region as the position of the needle tip in a case in which the needle region includes one needle tip region. In the other cases, the testing device 10 according to the present embodiment determines the position of the centroid of the needle region as the position of the needle tip. As indicated in the validation results, according to the testing device 10 according to the present embodiment, it is possible to further highly precisely determine the position of the needle tip of the probe needle.

The segmentation model according to the present embodiment performs semantic segmentation based on deep learning. Although the image obtained by photographing the needle tip of the probe needle may include a plurality of probe needles, the image is not photographed with the needle tips of different probe needles being overlapped with each other. Therefore, the testing device 10 according to the present embodiment can use semantic segmentation that is a relatively light process.

The segmentation model according to the present embodiment undergoes deep learning to optimize the error of the position of the centroid of the needle region and the error of the position of the centroid of the needle tip region. Therefore, according to the testing device 10 according to the present embodiment, it is possible to further highly precisely determine the position of the needle tip of the probe needle.

According to one aspect, it is possible to highly precisely determine the position of the needle tip of the probe needle.

[Notes]

It should be understood that the testing device and the testing method according to the embodiments disclosed herein are illustrative and not restrictive in all respects. Substitutions and changes may be made in various forms to the embodiments without departing from the scope of claims recited and the spirit of the disclosure. The matters described in the above embodiments can take other configurations or can be combined with each other in such a scope that does not involve any contradiction.

What is claimed is:

1. A testing device, comprising:
   a photographing unit configured to photograph a needle tip of a probe needle provided in a probe card used for testing of a test object;
   a segmenting unit configured to recognize a needle tip region and a needle region around the needle tip region in a validation image photographed by the photographing unit, and generate a segmented image in which the needle tip region and the needle region around the needle tip region are segmented, by inputting the validation image to a segmentation model that is trained using training data including training images each obtained by photographing the needle tip of the probe needle, the training images each being given a scope of the probe needle and a scope of the needle tip;
   a position determining unit configured to determine a position of the needle tip based on a positional relationship between the needle region and the needle tip region; and
   a position adjusting unit configured to adjust a relative position between the test object and the needle tip of the probe needle based on the position of the needle tip determined by the position determining unit.

2. The testing device according to claim 1, wherein the position determining unit determines the position of the needle tip based on the needle region or the needle tip region in accordance with a number of the needle tip regions included in the needle region.

3. The testing device according to claim 2, wherein the position determining unit determines a position of a centroid of the needle tip region as the position of the needle tip in a case in which the needle region includes one needle tip region; or the position determining unit determines a position of a centroid of the needle region as the position of the needle tip in a case in which the needle region does not include the needle tip region or the needle region includes a plurality of needle tip regions.

4. The testing device according to claim 3, wherein the segmentation model performs semantic segmentation based on deep learning.

5. The testing device according to claim 4, wherein the segmentation model undergoes deep learning to optimize an error of the position of the centroid of the needle region and an error of the position of the centroid of the needle tip region, the positions of the centroids being recognized from the training images.

6. The testing device according to claim 2, wherein the segmentation model performs semantic segmentation based on deep learning.

7. The testing device according to claim 6, wherein the segmentation model undergoes deep learning to optimize an error of a position of a centroid of the needle region and an error of a position of a centroid of the needle tip region, the positions of the centroids being recognized from the training images.

8. The testing device according to claim 1, wherein the segmentation model performs semantic segmentation based on deep learning.

9. The testing device according to claim 8, wherein the segmentation model undergoes deep learning to optimize an error of a position of a centroid of the needle region and an error of a position of a centroid of the needle tip region, the positions of the centroids being recognized from the training images.

10. A testing method, comprising:

a) photographing a needle tip of a probe needle provided in a probe card used for testing of a test object;

b) recognizing a needle tip region and a needle region around the needle tip region in a validation image photographed in the a), and generating a segmented image in which the needle tip region and the needle region around the needle tip region are segmented, by inputting the validation image to a segmentation model that is trained using training data including training images each obtained by photographing the needle tip of the probe needle, the training images each being given a scope of the probe needle and a scope of the needle tip;

c) determining a position of the needle tip based on a positional relationship between the needle region and the needle tip region; and d) adjusting a relative position between the test object and the needle tip of the probe needle based on the position of the needle tip determined in the c).

11. A non-transitory computer-readable recording medium storing a program that causes a control device to execute a process comprising:

recognizing a needle tip region and a needle region around the needle tip region in a validation image obtained by photographing a needle tip of a probe needle provided in a probe card used for testing of a test object, and generating a segmented image in which the needle tip region and the needle region around the needle tip region are segmented, by inputting the validation image to a segmentation model that is trained using training data including training images each obtained by photographing the needle tip of the probe needle, the training images each being given a scope of the probe needle and a scope of the needle tip; and determining a position of the needle tip based on a positional relationship between the needle region and the needle tip region.

* * * * *